(12) United States Patent
Lindmark

(10) Patent No.: US 8,970,328 B2
(45) Date of Patent: *Mar. 3, 2015

(54) TEM MODE TRANSMISSION LINE COMPRISING A CONDUCTOR LINE MOUNTED IN A THREE SIDED OPEN GROOVE AND METHOD OF MANUFACTURE

(75) Inventor: Björn Lindmark, Sollentuna (SE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/442,376

(22) PCT Filed: Sep. 24, 2007

(86) PCT No.: PCT/SE2007/000834
§ 371 (c)(1),
(2), (4) Date: Jul. 6, 2009

(87) PCT Pub. No.: WO2008/036029
PCT Pub. Date: Mar. 27, 2008

(65) Prior Publication Data
US 2009/0302977 A1    Dec. 10, 2009

(30) Foreign Application Priority Data
Sep. 22, 2006    (SE) ...................................... 0601971

(51) Int. Cl.
*H01P 3/08*    (2006.01)
*H01P 3/02*    (2006.01)
(Continued)

(52) U.S. Cl.
CPC  *H01P 3/02* (2013.01); *H01P 3/084* (2013.01); *H01P 11/001* (2013.01); *H05K 1/024* (2013.01); *H05K 3/107* (2013.01); *H05K 3/202* (2013.01); *H05K 2201/09236* (2013.01)
USPC .......................................... 333/238; 333/246

(58) Field of Classification Search
CPC ....................................................... H01P 3/084
USPC .................................. 333/238, 243, 245, 246
See application file for complete search history.

(56) References Cited

U.S. PATENT DOCUMENTS 3,496,492 A * 2/1970 Kurzl et al. ................... 333/116
3,518,579 A    6/1970 Hoffman
(Continued)

OTHER PUBLICATIONS

PCT International Search Report for International Application No. PCT/SE2007/000834 dated Dec. 18, 2007.
(Continued)

*Primary Examiner* — Benny Lee
(74) *Attorney, Agent, or Firm* — Caseiro Burke LLC; Chris A. Caseiro

(57) ABSTRACT

Method of manufacturing a transmission line including the steps:—forming an element with at least one longitudinal groove on a surface of the element, the longitudinal groove being defined by two opposite wall portions in the element and having a longitudinal opening adjacent to the surface, and—locating a conductor line in the at least one longitudinal groove. The method is distinguished by the steps:—forming the conductor line from a metal strip upon punching the same from a sheet of metal,—attaching the metal strip to at least one holding device, and—mounting the at least one holding device, with the attached metal strip, on the element, so as to locate the metal strip in the longitudinal groove at a distance from the opposite wall portions of the element. The invention also concerns a transmission line manufactured in accordance with the method.

2 Claims, 8 Drawing Sheets

(51) Int. Cl.
  *H01P 11/00* (2006.01)
  *H05K 1/02* (2006.01)
  *H05K 3/10* (2006.01)
  *H05K 3/20* (2006.01)

(56) References Cited

U.S. PATENT DOCUMENTS

| | | | |
|---|---|---|---|
| 3,863,181 A | | 1/1975 | Glance et al. |
| 3,904,997 A | * | 9/1975 | Stinehelfer, Sr. ............. 333/116 |
| 4,365,222 A | * | 12/1982 | Lampert ....................... 333/238 |
| 4,437,074 A | * | 3/1984 | Cohen et al. .................. 333/128 |
| 4,575,700 A | | 3/1986 | Dalman |
| 5,319,329 A | | 6/1994 | Shiau et al. |
| 5,652,557 A | | 7/1997 | Ishikawa |
| 2005/0190019 A1 | | 9/2005 | Metz |

OTHER PUBLICATIONS

Wadell, Brian C., "Transmission Line Design Handbook," Artech House, 1991, p. 63.
Wheeler, H.A., "Transmission-Line Properties of a Round Wire in a Polygon Shield," IEEE Transactions on Microwave Theory and Techniques, vol. MTT-27, No. 8, pp. 717-721, Aug., 1979.
Office Action dated Nov. 17, 2010 from U.S. Appl. No. 12/406,839.
Office Action dated Oct. 5, 2011 from U.S. Appl. No. 12/406,839.
Notice of Allowance dated Mar. 15, 2012 from U.S. Appl. No. 12/406,839.

* cited by examiner

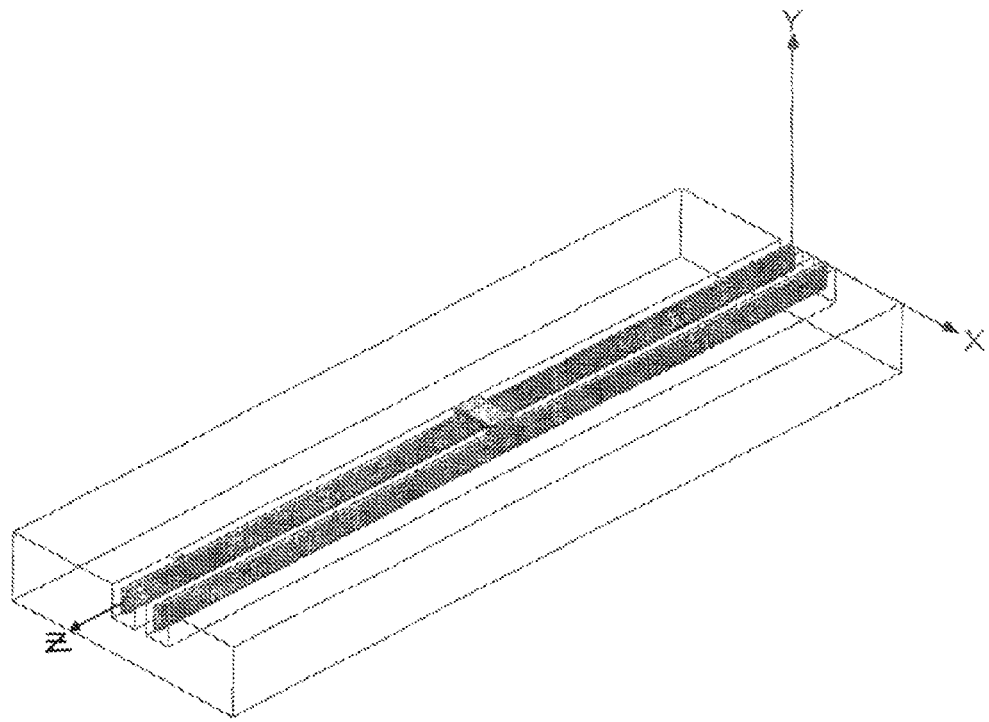
Fig. 1a
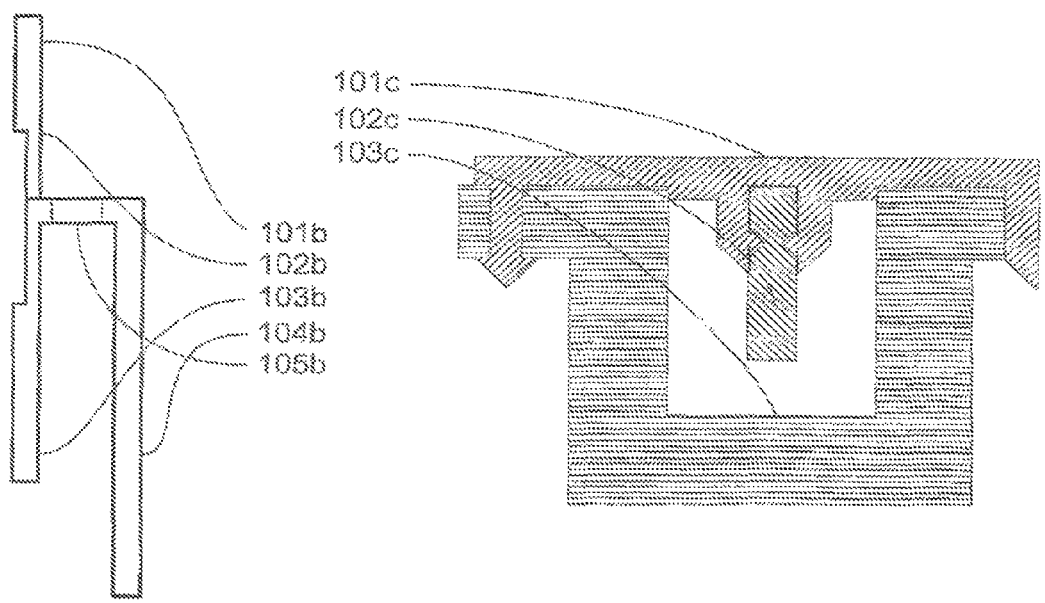
Fig. 1b
Fig. 1c

TEM MODE TRANSMISSION LINE COMPRISING A CONDUCTOR LINE MOUNTED IN A THREE SIDED OPEN GROOVE AND METHOD OF MANUFACTURE

FIELD OF THE INVENTION

The present invention concerns a method for the manufacture of a transmission line. Further, it concerns such a transmission line.

PRIOR ART

The use of microstrip lines with air as the dielectric has been used in base station antennas since at least the middle of the 1990s. The advantage is low loss and ease of manufacture in the sense that a flat ground plane can be used for the lines. The disadvantage of such lines is the necessary width, which for e.g. a 3 mm separation is 13 mm for a 50 ohms line. The absence of a dielectric, other than air, also means that the mutual coupling is rather high.

As another prior art in respect of the present invention U.S. Pat. No. 5,652,557 could be mentioned. This patent discloses a transmission line consisting of a longitudinal groove having longitudinal metal walls and a longitudinal opening. In the groove, a microstrip conductor line is formed.

However, the microstrip conductor of U.S. Pat. No. 5,652,557 is manufactured by disposing a conductor film on a dielectric. Such a production method can be complex and expensive.

THE OBJECT OF THE INVENTION AND ITS MOST IMPORTANT CHARACTERISTICS

It is an object of the present invention to propose a solution for or a reduction of the problems of prior art. A main object is consequently to devise a method for manufacturing a transverse electric magnetic (TEM) mode transmission line, that provides a transmission line having beneficial electric properties and at the same time is a method that is both rational and easy to employ.

According to the invention this is accomplished by a method described herein. According to this method, a transmission line can be produced by forming a metal strip through punching a metal sheet and then fastening the metal strip in a longitudinal groove by means of a holding device or spacer. This is a rational method: it is easy to punch a metal sheet to form the metal strip, and the provision of a holding device enables an easy mounting of the metal strip in production.

According to another aspect of the invention, one or more of the above objectives is reached with a transmission line described herein. This is a straightforward solution for a transmission line that lends itself to a rational production of the same.

An alternative transmission line geometry well suited to a base station antenna structure is presented. FIG. 1a is an isometric drawing of two parallel transmission lines placed in to longitudinal grooves running along the Z orientation axis. The height or the depth of the object is measured along the vertical Y axis. The widths of objects are measured along the X axis. As shown in FIG. 1a, the microstrip lines are rotated 90 degrees and placed in a longitudinal groove, or "canyon", on a surface of an element. The longitudinal groove being defined by two opposite wall portions in the element and having a longitudinal opening adjacent to the surface. At least a surface layer of the opposite wall are formed by an electrically conductive material, such as metal. This makes the mutual coupling, as will be demonstrated in the following sections. The proposed line is well suited for base station antennas since these have a long transmission lines extending primarily in the array direction. Furthermore, the grooves are readily accommodated if the antenna reflector is made from an aluminum extrusion. The proposed line is similar to the trough or channel line of [1-2](where the numbered references, in brackets, are listed at the end of the description), but differs in that the center conductor is aligned with the top edge of the channel. The proposed "canyon stripline" also has an advantaged in the use of a metal strip as opposed to a wire, since a strip allow us good control of the characteristic impedance.

The characteristic impedance of the line is controlled by changing the height of the line. FIG. 1a also shows an interconnect between the two lines. In the manufacture, the complete line, or metal strip, could be punched out of a single piece of sheet metal with little loss of material and then bent 90° along two lines. The U-shaped line pair could then be attached to at least one holding device or spacer, inserted into the grooves of the element and fastened at a distance from the wall portions forming the grooves using the at least one holding device or spacer. The at least one holding device is mounted on the element, e.g. in the vicinity of the opening of a longitudinal groove. The holding device 101c as illustrated in FIG. 1c could for instance be made of a plastic material. One design of such a transmission line is shown in FIGS. 1a, 1b and 1c, but there are numerous alternatives how this could be done. For instance, a single line, or metal strip, could be punched out and used in a single groove. Moreover, the holding device or spacer could be made of any material with sufficient isolation properties.

The proposed transmission line is compared with a standard air-microstrip line of similar dimensions. The simulations, using a software, HFSS, for 3D electromagnetic-field simulation, confirm that the proposed line has lower loss and mutual coupling than air microstrip.

BRIEF DESCRIPTION OF THE DRAWINGS

Embodiments exemplifying the invention will now be described, by means of the appended drawings, on which FIG. 1a illustrates two parallel transmission lines, according to the invention placed in two longitudinal grooves or "canyons."

FIG. 1b illustrates the two parallel transmission lines in an embodiment such that the complete assembly could be punched out of a single piece of sheet metal.

FIG. 1c illustrates a possible solution to attach the line to a reflector.

FIG. 2b illustrates the field distribution in a transmission line according to FIG. 2a.

FIG. 4b illustrates the simulated loss of the line in FIG. 4a.

FIG. 6a illustrates a simulation of two parallel transmission lines with a cross-over in between.

DETAILED DESCRIPTION OF EXEMPLARY EMBODIMENTS

FIG. 1a illustrates two parallel lines of the proposed "canyon line" design. The two lines (darkly shaded) are connected by a cross-over part at the center and the complete assembly could be punched out of a single piece of sheet metal as shown in FIG. 1b. Here, 101b denotes an output end of 50 Ohms, 102b denotes a 70 Ohms transformer, 103b denotes a 50 Ohms output end, 104b denotes a 50 Ohms input end and, finally, 105b denotes folded cross-over sections. FIG. 1c shows a possible solution for a holding device 101c to attach the line 102c to the reflector 103c. The reflector could for instance by of extruded aluminum.

Figure 2A:
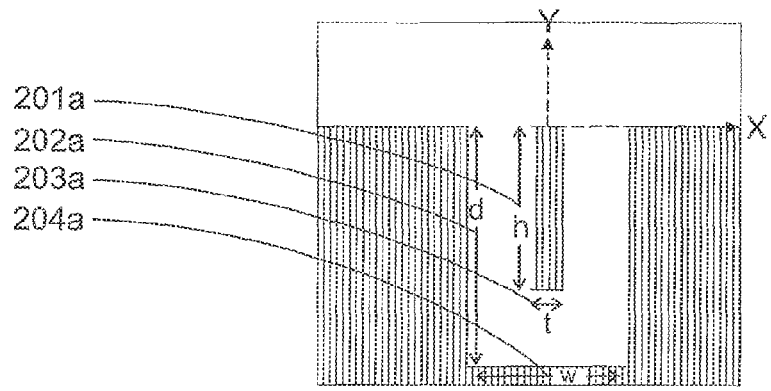
FIG. 2a illustrates the geometry of a transmission line according to the invention.
Figure 2B:
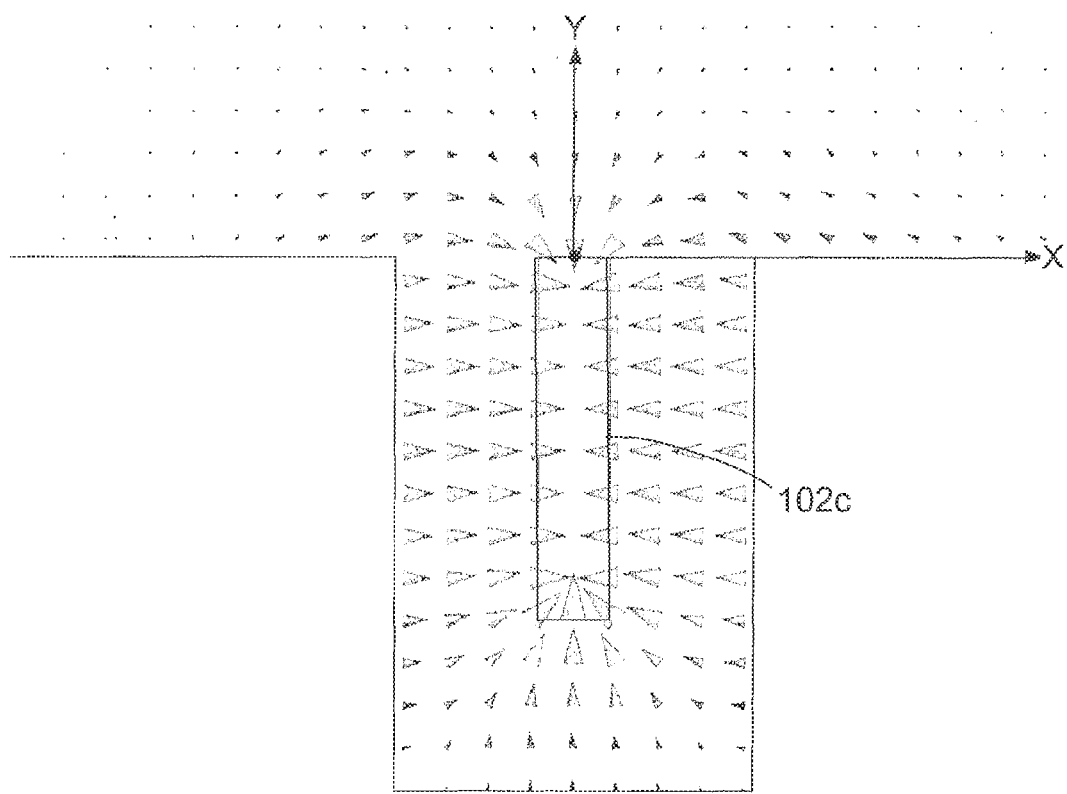
Figure 3:
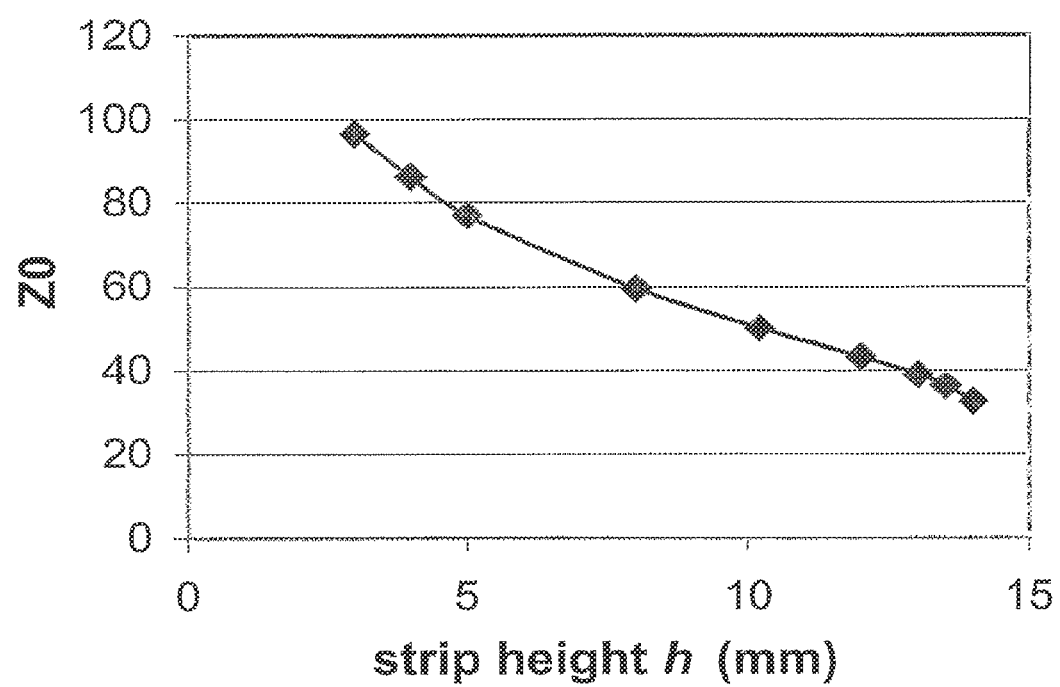
FIG. 3 illustrates the relationship between impedance and strip height for a transmission line according to the invention.
Figure 4A:
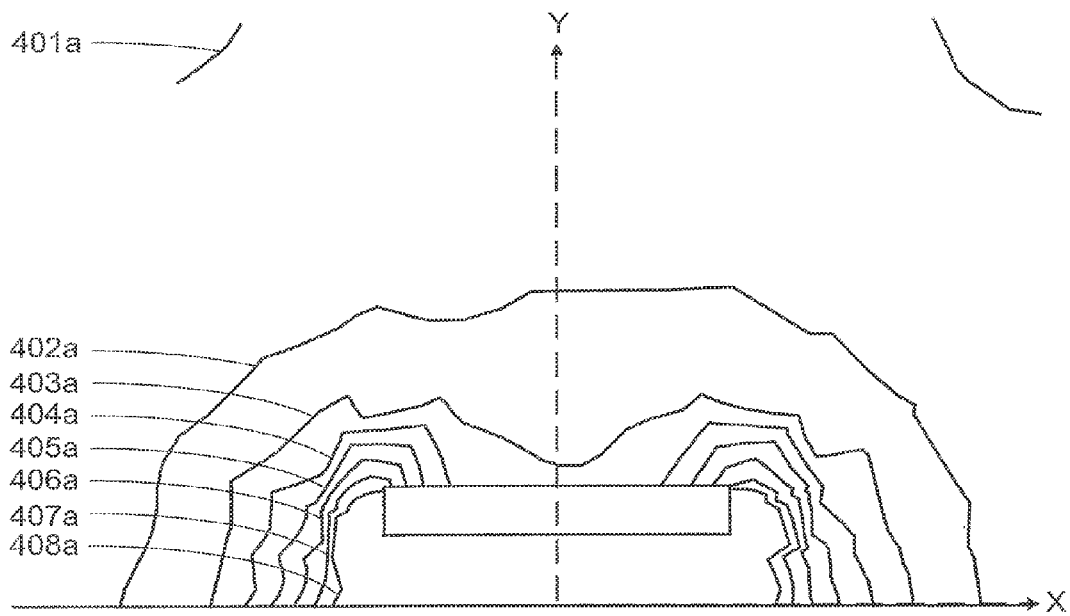
FIG. 4a illustrates a cross-section of a line with the simulated field distribution.
Figure 4B:
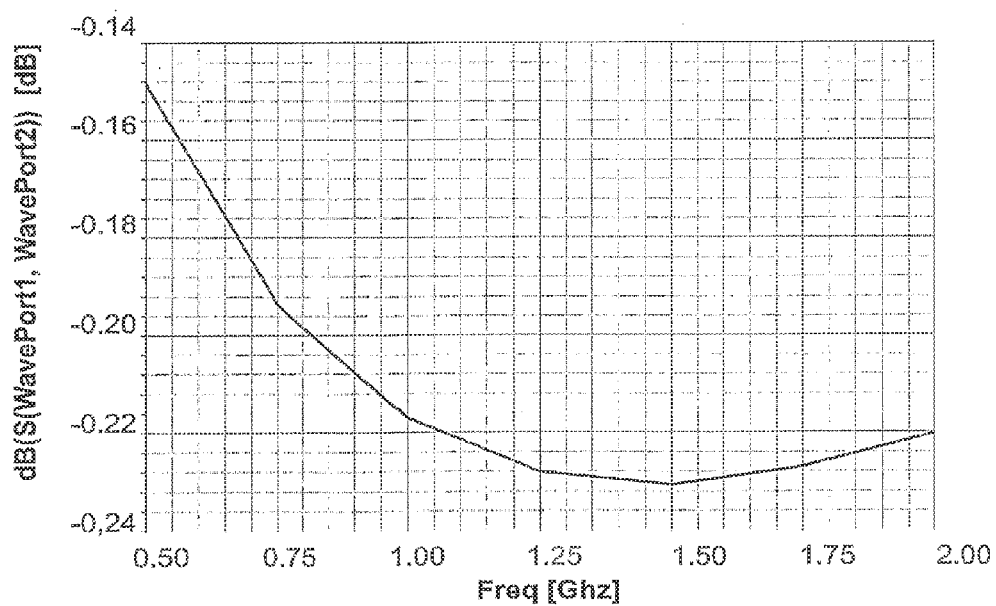
Figure 4C:
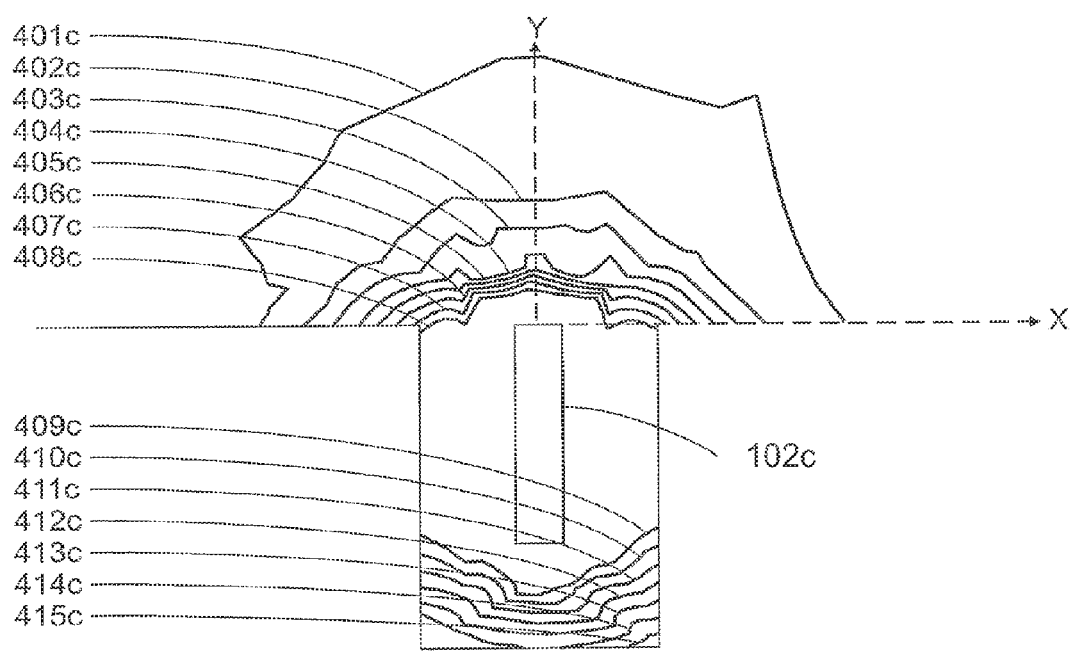
FIG. 4c illustrates a cross-section of a line with the simulated field distribution.

The first step in the design is to determine the dimensions of the proposed line for 50Ω operation. FIGS. 2a and 2b illustrates the geometry and field distribution respectively in the proposed TEM transmission line. FIG. 2a is a cross sectional view of a transmission line (102c) as shown in FIG. 2b placed in a longitudinal groove (103c), as shown in FIG. 1c defined by dissection XY plane as shown in FIG. 2a. A vertical strip is placed in a groove in e.g. an aluminum extrusion. FIG. 2b illustrates the field distribution in the proposed TEM transmission line 102c. As seen in FIG. 2b, the field of distribution is quite similar to a stripline. FIG. 2b proves a cross sectional view of canyon line which in addition to physical elements also includes electric field distribution, direction and strength as indicated by arrows direction and size in and about the transmission line suspended in a longitudinal groove. The X and Y are coordinate axis or just axis of the system, and the point where they meet its origin usually at ordered pair (0, 0). The Cartesian coordinate system is based on three perpendicular axes, X, Y, and Z, intersecting at one point. The coordinate can also be defined as the positions of the perpendicular projections of the point onto the two axes, expressed as signed distances from the origin. In FIG. 2b the z-axis is protruding outwardly from the page plane and thus is not labeled. The characteristic impedance is thus roughly inversely proportional to the strip height h over a rather large region, since the fundamental effect is that the capacitance is increased per unit length. The calculated impedance using HFSS (a commercially available 3-D full-wave EM field simulation software package is shown in FIG. 3. FIG. 3 illustrates line impedance $z_0$ vs. strip height h in mm for the purpose "canyon line". Other dimensions: width w=10 mm, depth d=15 mm, thickness t=2 mm, compare FIG. 2a. In FIG. 2a, height is reference by 201a, width w by 204a, depth d by 202a and thickness t by 203 a. For narrow strips the behavior deviates since the relative amount of fringing fields will be larger, just as for a regular microstrip and stripline. It should also be noted that the linear behavior is broken as the height h approaches the groove depth d, which in this case is 15 mm. Thus, for a robust design, the groove width w and depth d should be chose so that z0 can be changed over a desired range without having to let the height h be close to the depth d. Using HFSS, two 300 mm long transmission lines have been compared, one being traditional air microstrip and the second the proposed line. The cross-sections of the lines with the simulated field distribution are shown in FIGS. 4a-4c along with simulated loss. FIGS. 4a-4c illustrate an HFFS simulation of a single transmission line. FIG. 4a represents a cross sectional view of electric field distribution of a single transmission line suspended above the ground place set along x axis. The manner of interpreting a cross sectional view of an electric field distribution is well known in the art. In FIG. 4b, a simulated insertion loss of a microstrip line as shown in FIG. 4a is presented. As previously disclosed herein the microstrip line is 300 mm long or 1 lambda (i.e., 1λ) at 21 GHz, width (the X dimension of the conductor) 13 mm, thickness (the Y dimension) 2 mm, distance to the ground is 3 mm. In FIG. 4b horizontal axis is a frequency of signal applied to such microstrip line and vertical axis is a simulated insertion loss in dB. FIG. 4b represents simulated insertion loss in dB. FIG. 4b represents simulated insertion loss S (in dB) of a 300 mm long transmission line, between WavePort 1 and WavePort 2, of FIG. 4a as a function of frequency in GHz. The line length is 300 mm or 1λ at 1 GHz. In FIGS. 4a and 4b; a microstrip line of width 13 mm, thickness=2 mm, distance to ground=3 mm. FIG. 4c represents a cross sectional view of electric field distribution of a single transmission line suspended in the open groove (as in a preferred embodiment). FIG. 4c is similar to FIG. 2b with the exception being the electric field arrows are replaced with contours lines. In general, a contour line can be used to plot a function with two variables (X, Y) and a curve is connecting points where the function has the same particular value (electric field value). In this particular example the electric field value along curve 408c is the same. However, electric field value is different along curve 407c. The gradient of the function is always perpendicular to the contour lines. When the lines are close together the magnitude of the gradient is large: the variation is steep. This is just another way to represent electric field distribution around canyon line 102c. In FIG. 4c: the proposed "canyon line" with depth d=15 mm, width w=10 mm, height h=10.2 mm, thickness t=2 mm. It should be noted that the losses are smaller in the proposed line, although the material is the same and the dimensions quite similar. The reason is the more efficient use of the conducting strip area when the field is distributed on both sides of the strip.

The resulting E-fields, in Volts/meter [V/m] of the simulations can be summarized for FIG. 4a as:

| | Reference numeral | | | | | | | |
|---|---|---|---|---|---|---|---|---|
| | 401a | 402a | 403a | 404a | 405a | 406a | 407a | 408a |
| E-field [V/m] | 125 | 375 | 625 | 875 | 1125 | 1375 | 1625 | 1875 |

The E-fields for FIG. 4c as:

| | Reference numeral | | | | | | | |
|---|---|---|---|---|---|---|---|---|
| | | 402c | 403c | 404c | 405c | 406c | 407c | 408c |
| | 401c | 415c | 414c | 413c | 412c | 411c | 410c | 409c |
| E-field [V/m] | 125 | 375 | 625 | 875 | 1125 | 1375 | 1625 | 1875 |

HFSS Simulations of Two Parallel Lines

Figure 5A:
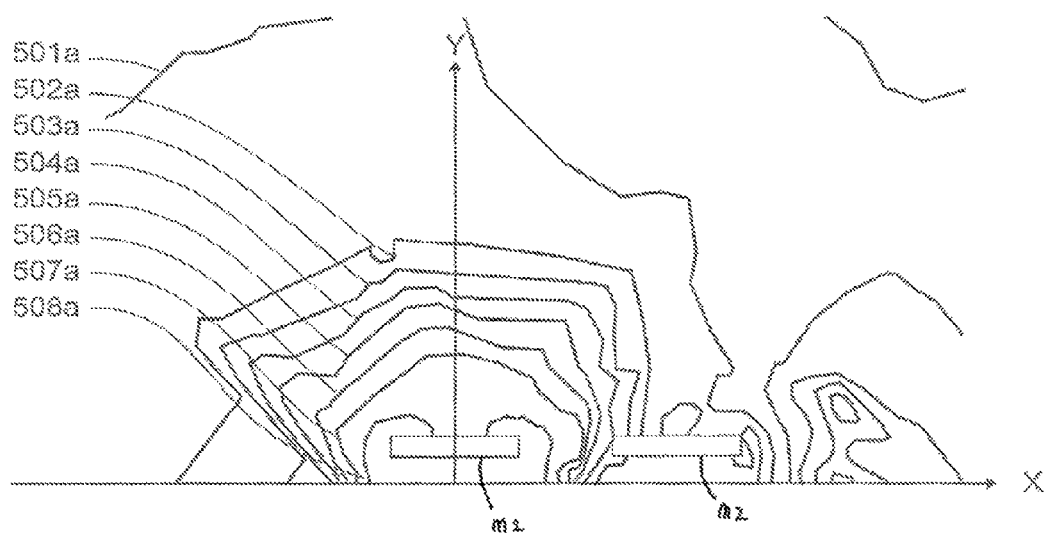
FIG. 5a illustrates a cross-section of two lines with simulated field distribution, in order to consider mutual coupling.
Figure 5B:
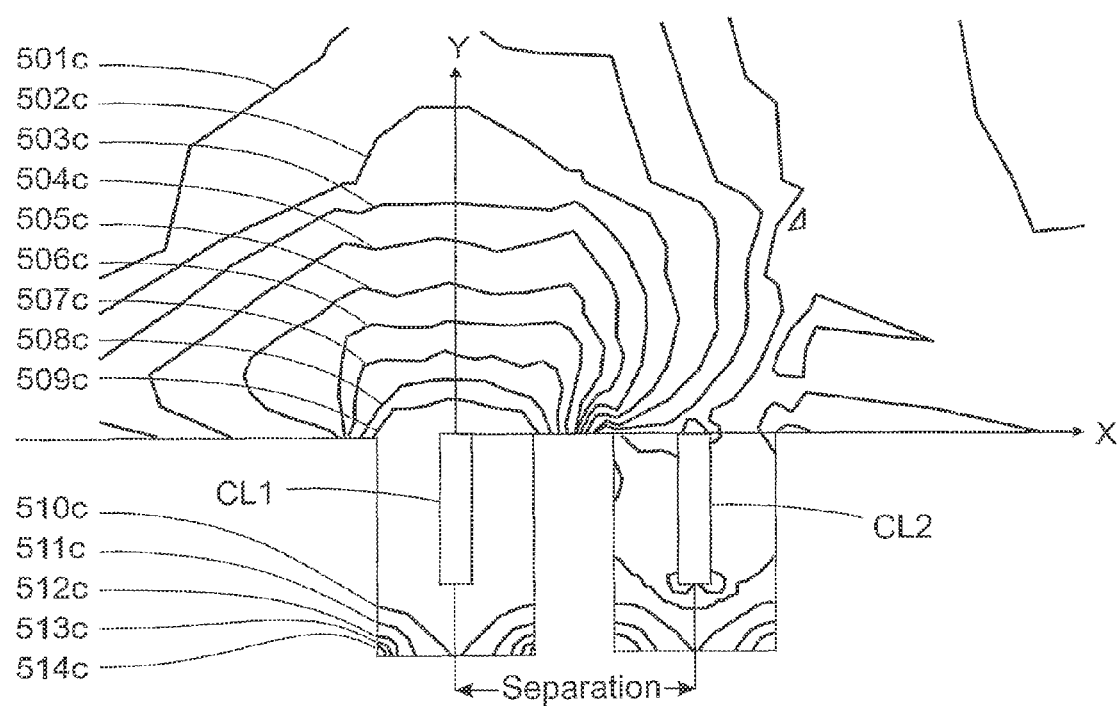
FIG. 5b illustrates a cross-section of two lines with simulated field distribution, in order to consider mutual coupling. Simulations of the two comparable geometries shown in FIG. 5b have been made.

In order to compare the proposed transmission line to air microstrip, the mutual coupling should be considered. For this purpose, simulations of the two comparable geometries shown in FIG. 5a and FIG. 5b have been made. FIGS. 5a-5b illustrate an HFSS simulation of two parallel lines. Length is 300 mm. In FIG. 5a two edge coupled microstrip lines (M1, M2) are shown. Same as in FIG. 4c the contour lines indicate constant electric field strength (along the contour line) FIG. 5a: microstrip lines as in FIG. 4a with an edge-to-edge separation of 9 mm. Total width is 35 mm. FIG. 5b: proposed "canyon lines" with a separation of 5 mm. Total width is 25 mm. Both pair of lines are 300 mm long and the case of FIG. 5b (the proposed "canyon line") is in fact the same as in FIG. 1a, except for the cross-over section omitted in FIG. 5b. In FIG. 5b the contour lines indicate constant electric field strength (along the contour lines) for two canyon lines CL1, CL2, as in FIG. 1a minus crossover (see above), with a separation by a center to center distance of 5 mm. It turns out that the proposed line may be used with as little as 15 mm center to center separation, but this is not possible for the microstrip due to the width of the strip (13 mm). Instead, the separation was increased so that the microstrip pair of lines occupy a width of 35 mm compared to the 25 mm for the proposed "canyon stripline" pairs. Since the "canyon line" uses space below the ground plane, it is perhaps still a fair comparison. Note that a comparison between two transmission line geometries is always arbitrary to some degree. It is therefore possible that another choice of e.g. height-to-width ratio would give a slightly different result for the microstrip line. However, the microstrip design used here should be rather beneficial since the distance to ground of 3 mm reduces mutual coupling. The simulation results in FIGS. 5a-5b clearly show that the fields are more confined in the proposed line. The field strength at the second line due to a 1 W signal input on the first line is 10 times weaker compared to the microstrip line. This corresponds to a 20 dB lower coupling. Note the periodic behavior in the coupling caused by the finite line length of 300 mm, or 1λ at 1 GHz.

The resulting E-fields, in Volts/meter [V/m] of the simulations can be summarized for FIG. 5a as:

| Reference numeral | | | | | | | |
|---|---|---|---|---|---|---|---|
| 501a | 502a | 503a | 504a | 505a | 506a | 507a | 508a |
| E-field [V/m] 45.255 | 72.882 | 117.38 | 189.03 | 304.44 | 490.29 | 789.61 | 1271.7 |

The E-fields for FIG. 5b as:

| Reference numeral | | | | | | | | |
|---|---|---|---|---|---|---|---|---|
| 501c | 502c | 503c | 504c | 505c 514c | 506c 513c | 507c 512c | 508c 511c | 509c 510c |
| E-field [V/m] 28.100 | 45.255 | 72.882 | 117.38 | 189.03 | 304.44 | 490.29 | 789.61 | 1271.7 |

Figure 6A:
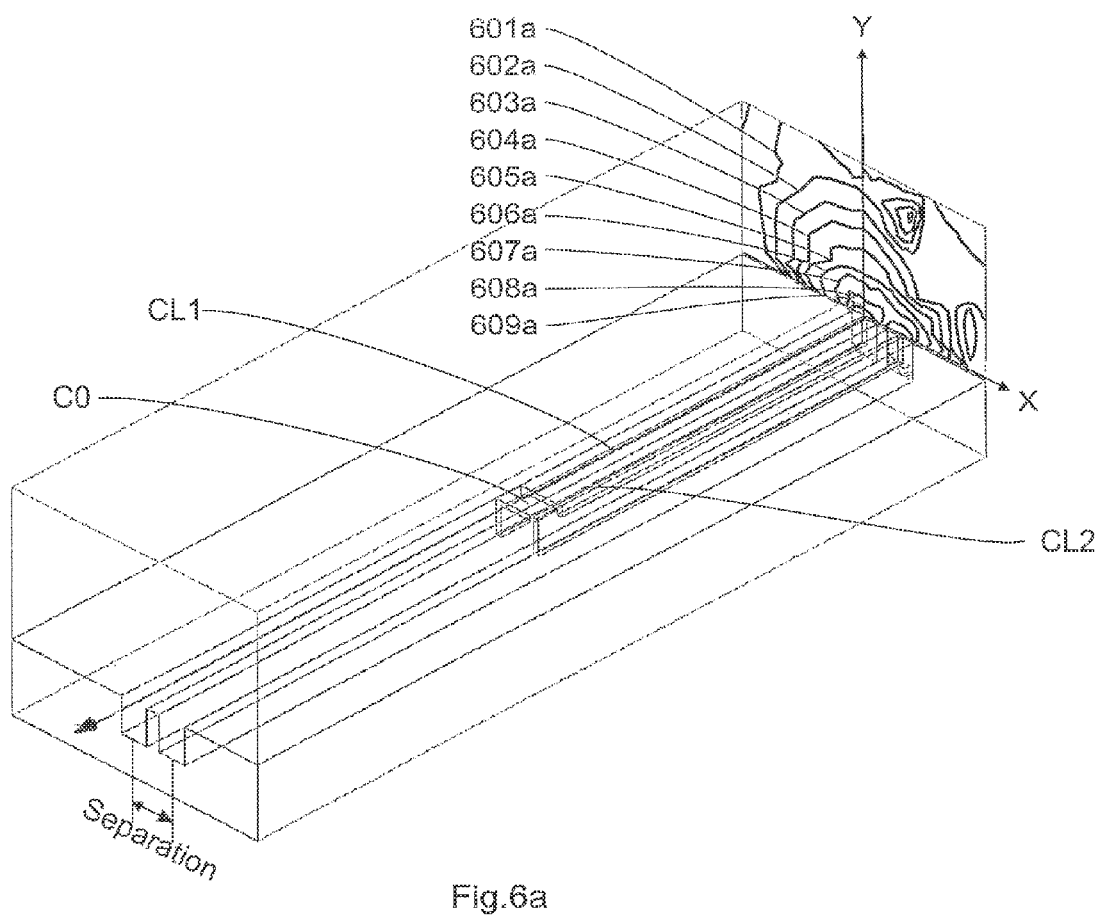

Finally, a design was simulated where a cross-over section is placed between two parallel lines of the proposed "canyon stripline". FIG. 6a illustrates an HFSS simulation of two parallel "canyon lines" with a cross-over between them. FIG. 6a is an isometric view of the two canyon lines CL1, CL2 with crossover installed CO. The contour lines indicate constant electric field strength (along the contour lines) for two canyon lines CL1, CL2, as in FIG. 1a, with crossover CO, separated by a center to center distance of 5 mm. As seen in FIG. 6a, two 50 ohms lines are connected at a point halfway along the ground plane. The total transmission line length is thus as before 300 mm. It turns out that it is quite easy to achieve a low reflection at low frequencies, but at higher frequencies the inductance becomes a problem. A simulation of an insertion loss of 300 mm long transmission structure comprising a pair of "canyon lines" interconnected by a cross-over as a function of operating frequency. At 1 GHz, the reflection is quite acceptable, −40 dB. The simulated loss at 1 GHz has increased from 0.03 dB for the straight line (FIG. 2a) to 0.05 dB, which indicates that radiation is a small concern at this frequency.

The resulting E-fields, in Volts/meter [V/m] of the simulation can be summarized for FIG. 6a as:

| Reference numeral | | | | | | | | |
|---|---|---|---|---|---|---|---|---|
| 601a | 602a | 603a | 606a | 606a | 606a | 607a | 608a | 609a |
| E-field [V/m] 10.834 | 17.448 | 28.100 | 45.255 | 72.882 | 117.38 | 189.03 | 490.29 | 1271.7 |

CONCLUSIONS

Numerical HFSS simulations of a "canyon stripline" has been presented and compared it to a traditional air microstrip. The design is well-suited for integration in base station antennas using extruded reflectors. The simulation results show that the proposed line has lower losses and lower mutual coupling.

There are many variations of the invention. For instance, the wall portions forming the groove(s) in the element can be made of a thin sheet of conducting material or paint placed on a non-conducting material. The holding device could be snap-fitted to the metal strip by the use of e.g. arms fitted into one or more holes of the metal strip. The holding device could be attached to the element by the use of e.g. rivets that could be an integral part of the holding device. This would enable the metal strip with the spacer(s) to be mounted in a single step.

REFERENCES

1. Brian C. Wadell, "Transmission Line Design Handbook", Artech House, 1991.

2. H. A. Wheeler, "Transmission-Line Properties of a Round Wire in a Polygon Shield". IEEE Transactions on Microwave Theory and Techniques, Vol. MTTT-27, No. 8, pp. 717-721, August 1979.

The invention claimed is:

1. Method of manufacturing a transverse electric magnetic (TEM) mode transmission line comprising:
    forming an element with at least one longitudinal three sided open groove on a surface of said element, said at least one longitudinal three sided open groove being defined by a recessed bottom wall and two opposite wall portions in the element and having a longitudinal opening adjacent to said surface, at least a surface layer of said opposite wall portions being formed by an electrically conductive material, and
    locating a conductor line in said at least one longitudinal groove, the method further comprising:
    forming the conductor line from a metal strip having a width, being punched from a sheet of metal,
    attaching the metal strip to at least one holding device, and
    mounting said at least one holding device, with the attached metal strip, on said element, so as to suspend from the longitudinal opening and locate said metal strip in said at least one longitudinal three sided open groove located apart and away from the recessed bottom wall and located at a distance from said opposite wall portions of said element, wherein the width of the metal strip is parallel with the two opposite wall portions in the element.

2. A transverse electric magnetic (TEM) mode transmission line, comprising:
    an element with at least one longitudinal three sided open groove on a surface of said element, said at least one longitudinal three sided open groove being defined by a recessed bottom wall and two opposite wall portions in the element and having a longitudinal opening adjacent to said surface, at least a surface layer of said opposite wall portions being formed by an electrically conductive material, and
    a conductor line located in said at least one longitudinal groove,
    wherein:
    the conductor line is formed by a metal strip having a width, being punched from a sheet of metal,
    said metal strip is attached to at least one holding device, and
    said at least one holding device, with the attached metal strip, is mounted on said element, so that said metal strip is suspended from the longitudinal opening and located in said at least one longitudinal three sided open groove located apart and away from the recessed bottom wall and located at a distance from said opposite wall portions of said element, wherein the width of the metal strip is parallel with the two opposite wall portions in the element.

* * * * *